(12) United States Patent
Shimura et al.

(10) Patent No.: US 7,749,323 B2
(45) Date of Patent: Jul. 6, 2010

(54) SINGLE CRYSTAL FOR SCINTILLATOR AND METHOD FOR MANUFACTURING SAME

(75) Inventors: Naoaki Shimura, Hitachinaka (JP); Yasushi Kurata, Hitachinaka (JP); Tatsuya Usui, Hitachinaka (JP); Kazuhisa Kurashige, Hitachinaka (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 366 days.

(21) Appl. No.: 11/806,257

(22) Filed: May 30, 2007

(65) Prior Publication Data

US 2008/0089824 A1    Apr. 17, 2008

(30) Foreign Application Priority Data

May 30, 2006 (JP) ............ P2006-149677
Dec. 4, 2006 (JP) ............ P2006-327365

(51) Int. Cl.
*C30B 29/22* (2006.01)
(52) U.S. Cl. .......... 117/4; 117/8; 117/9; 117/944
(58) Field of Classification Search ......... 117/4, 117/7, 8, 9, 944
See application file for complete search history.

(56) References Cited

U.S. PATENT DOCUMENTS

| 4,958,080 A | 9/1990 | Melcher |
| 5,264,154 A | 11/1993 | Akiyama et al. |
| 6,278,832 B1 | 8/2001 | Zagumennyi et al. |

FOREIGN PATENT DOCUMENTS

| JP | 64-6160 B2 | 2/1989 |
| JP | 7-78215 B2 | 8/1995 |
| JP | 9-142994 A | 6/1997 |
| JP | 2701577 B2 | 1/1998 |
| JP | 2852944 B2 | 2/1999 |
| JP | 2001-524163 A | 11/2001 |
| JP | 2003-300795 A | 10/2003 |
| JP | 2004-59382 A | 2/2004 |

*Primary Examiner*—Robert M Kunemund
(74) *Attorney, Agent, or Firm*—Westerman, Hattori, Daniels & Adrian, LLP

(57) ABSTRACT

A single crystal for a scintillator that is a specific single crystal of a cerium-activated orthosilicate compound that comprises 0.00005 to 0.1 wt. %, based on the entire weight of the single crystal, of at least one element selected from a group consisting of elements belonging to Group 13 of the periodic table.

14 Claims, 1 Drawing Sheet

SINGLE CRYSTAL FOR SCINTILLATOR AND METHOD FOR MANUFACTURING SAME

BACKGROUND OF THE INVENTION

1. Field of the Invention

The present invention relates to a single crystal for a scintillator and a method for manufacturing the single crystal. More particularly, the present invention relates to a to a single crystal for a scintillator for use in single crystal scintillation detectors (scintillators) of radiation such as gamma radiation in the field of radiation medicine, physics, physiology, chemistry, mineralogy, and oil prospecting, e.g., for positron CT (PET) for medical diagnosis, cosmic ray observations, and exploration of underground resources, and also to a method for manufacturing the single crystal.

2. Related Background Art

Scintillators of cerium-activated gadolinium orthosilicate have been used as radiation detectors, e.g., for positron CT, due to their short fluorescence decay time and a high radiation absorption coefficient. The fluorescence output of such scintillators is higher than that of BGO scintillators, but is only about 20% that of NaI (Tl) scintillators, and in this respect a significant improvement thereof is needed.

Scintillators using a single crystal of cerium-activated lutetium orthosilicate represented by $Lu_{2(1-x)}Ce_{2x}SiO_5$ (see specifications of Japanese Patent No. 2,852,944 and U.S. Pat. No. 4,958,080) are generally known. Scintillators using a single crystal of a compound represented by $Gd_{2-(x+y)}Ln_x$-$Ce_ySiO_5$ (Ln is Lu or one of rare earth elements) are also generally known (see specifications of Japanese Published Examined Patent Application No. 7-78215 and U.S. Pat. No. 5,264,154) are also generally known. These scintillators are known to have an increased density of crystals, and also an increased fluorescence output of single crystals of cerium-activated orthosilicate compounds and a shortened fluorescence decay time.

However, it was found that when a specific single crystal of cerium-activated orthosilicate compound is grown or cooled in an atmosphere comprising oxygen (for example, an atmosphere with an oxygen concentration of 0.2 vol. % or more) or when the single crystal is grown in an atmosphere with a low concentration of oxygen, if the single crystal is thereafter subjected to high-temperature heat treatment in an atmosphere comprising oxygen, the heat treatment causes coloration of the crystal and decrease in fluorescence output due to fluorescence absorption or the like (for example, see specification of Japanese Patent No. 2,701,577). Further, because single crystals of cerium-activated orthosilicate compounds have a high melting point, they are generally grown by a Czochralski method based on high-frequency heating in an Ir crucible. However, if an Ir crucible is heated to a high temperature in an atmosphere comprising oxygen, the crucible is evaporated and stable crystal growth is difficult to implement.

A method for heat treating a single crystal of cerium-activated gadolinium orthosilicate at a high temperature (at a temperature 50 to 550° C. lower than the melting point of the single crystal) in an atmosphere with a low concentration of oxygen is disclosed in Japanese Patent No. 2,701,577 as a method improving scintillation characteristics such as fluorescence output and energy resolution. According to the aforementioned document, the scintillation characteristics are improved due to the reduction of tetravalent Ce ions, which hinder the scintillation emission, into trivalent ions.

Further, Published Japanese translation of a PCT application No. 2001-524163 describes a scintillation material based on a silicate crystal comprising lutetium (Lu) and cerium (Ce), this material having an oxygen vacancy ☐ and the chemical composition of the material being represented by general formula (8) below.

$$Lu_{1-y}Me_yA_{1-x}Ce_xSiO_{5-z}\square_z \quad (8)$$

In formula (8), A stands for Lu and at least one element selected from a group consisting of Gd, Sc, Y, La, Pr, Nd, Sm, Eu, Tb, Dy, Ho, Er, Tm, Yb; and Me stands for at least one element selected from a group consisting of H, Li, Be, B, C, N, Na, Mg, Al, P, S, Cl, K, Ca, Ti, V, Cr, Mn, Fe, Co, Ni, Cu, Zn, Ga, Ge, As, Se, Rb, Sr, Zr, Nb, Mo, Ru, Rh, Pd, Ag, Cd, In, Sn, Sb, Cs, Ba, Hf, Ta, W, Re, Os, Ir, Pt, Au, Hg, Ti, Pb, Bi, U, Th.

Published Japanese translation of a PCT application No. 2001-524163 describes more than 50 elements from H to Th as Me that substitute Lu. These substitution elements are described to be effective in preventing the crystal from cracking when a scintillation element is cut and manufactured and for producing a waveguide characteristic in a waveguide element. Further, it is also described that if ions with a degree of oxidation of +4, +5, +6 (for example, Zr, Sn, Hf, As, V, Nb, Sb, Ta, Mo, W, Th) are present in the starting formulation, or if the necessary amount thereof is added to the scintillation material, these ions effectively prevent the crystal from cracking and also inhibit the formation of vacancies in the oxygen sublattice.

A method of heating a single crystal of tungsten oxide in an atmosphere comprising oxygen at a temperature within a range from the melting point of the crystal (excluding the melting point) to the temperature that is by 200° C. lower than the melting point or to a lower temperature is disclosed in Japanese Published Examined Patent Application No. 64-6160 as a heat treatment method that increases the fluorescence output of an oxide scintillator. Japanese Published Examined Patent Application No. 64-6160 describes that oxygen vacancies are easily generated in a single crystal of tungsten oxide and that the fluorescence output is increased by heating the crystal at a temperature close to the melting point in an atmosphere comprising oxygen to eliminate the oxygen vacancies.

Japanese Patent Application Laid-open No. 2003-300795 discloses that a single crystal of $Gd_{(2-x)}Ce_xMe_ySiO_5$ (x is 0.003 to 0.05, y is 0.00005 to 0.005, Me is an element selected from a group consisting of Mg, Ta, and Zr, or a mixture thereof) with no coloration and high transparency is obtained because the element represented by Me inhibits the valence change of Ce ions from 3 to 4.

Further, Japanese Patent Application Laid-open No. 9-142994 describes that when a single crystal of a rare earth silicate for use in a scintillator or the like is grown, the number of voids in the crystal is decreased by reducing the concentration of Al impurity in the raw material of rare earth oxide or the like to 0.4 ppm and below. Japanese Patent Application Laid-open No. 2004-59382 describes that a fluorescence decay time is shortened, while the scintillator characteristic is maintained, by incorporating Al in an amount of more than 0.4 ppm to 500 ppm or less to a single crystal of a rare earth silicate.

SUMMARY OF THE INVENTION

However, in the single crystals of cerium-activated orthosilicate compounds that are disclosed in Japanese Patent No. 2,852,944, U.S. Pat. No. 4,958,080, Japanese Published Examined Patent Application No. 7-78215, and U.S. Pat. No. 5,264,154 the background of fluorescence output increases easily. As a result, a spread of fluorescence characteristics inside a crystal ingot or between the crystal ingots, variation within a day, and variation thereof with time under natural light irradiation including ultraviolet radiation occur easily, and a stable fluorescence output characteristic is difficult to obtain.

Further, it was established that when single crystals of cerium-activated orthosilicate compounds represented by the following general formulas (1), (2), and (4), from amongst the single crystals of cerium-activated orthosilicate compounds, are grown or cooled in a neutral or reducing atmosphere with a low concentration of oxygen or in vacuum, or heated at a high temperature in a neutral or reducing atmosphere with a low concentration of oxygen or in vacuum after the growth, the background of fluorescence output rises, the fluorescence output decreases, and the spread of fluorescence characteristics increases.

$$Y_{2-(x+y)}Ln_xCe_ySiO_5 \quad (1)$$

wherein Ln denotes at least one element selected from a group consisting of elements belonging to rare earth elements, x is a numerical value of 0 to 2, and y is a numerical value of more than 0 and equal to or less than 0.2, $$Gd_{2-(z+w)}Ln_zCe_wSiO_5 \quad (2)$$

wherein Ln denotes at least one element selected from a group consisting of elements belonging to rare earth elements, z is a numerical value of more than 0 and equal to or less than 2, and w is a numerical value of more than 0 and equal to or less than 0.2, $$Gd_{2-(r+s)}Lu_rCe_sSiO_5 \quad (4)$$

wherein r is a numerical value of more than 0 and equal to or less than 2, and s is a numerical value of more than 0 and equal to or less than 0.2.

This tendency becomes especially significant in the case of single crystals using at least one element selected from a group consisting of Dy, Ho, Er, Tm, Yb, Lu, Y, and Sc, which are rare earth elements with an ion radius less than that of Tb, as the Ln in general formulas (1), (2), or (4) above, that is, in the case of single crystals represented by general formula (3) below.

$$Gd_{2-(p+q)}Lu_pCe_qSiO_5 \quad (3)$$

wherein Ln is at least one element selected from a group consisting of Dy, Ho, Er, Tm, Yb, Lu, Y, and Sc, which are rare earth elements with an ion radius less than that of Tb; p is a numerical value of more than 0 and equal to or less than 2, and q is a numerical value of more than 0 and equal to or less than 0.2.

Furthermore, the heat treatment method disclosed in Japanese Patent No. 2,701,577 demonstrates good results when carried out with respect to single crystals of $Gd_{2(1-x)}Ce_{2x}SiO_5$ (cerium-activated gadolinium orthosilicate). However, when single crystals of cerium-activated orthosilicate compounds represented by general formula (1) above and single crystals of cerium-activated gadolinium orthosilicate represented by general formula (2) or (4) above are the objects of the heat treatment, the background of fluorescence output increases. Therefore, the heat treatment was found to produce a negative effect of decreasing the fluorescence output and increasing the background of fluorescence output. This tendency becomes especially significant in the case of single crystals using at least one element selected from a group consisting of Dy, Ho, Er, Tm, Yb, Lu, Y, and Sc, which are rare earth elements with an ion radius less than that of Tb, as the Ln in general formula (1), (2), or (4) above.

Further, the inventors have discovered that oxygen vacancies (equivalent to oxygen lattice vacancies) are especially easily generated in single crystals of orthosilicates comprising Lu and Ce and represented by general formula (8) described in Published Japanese translation of a PCT application No. 2001-524163 because Lu is contained in such orthosilicate single crystals. Further, it was found that oxygen vacancies are easier generated in single crystals of orthosilicates in which a rare earth element other than Lu is Dy, Ho, Er, Tm, Yb, Lu, Y, or Sc, which has an ion radius less than that of Tb, than in single crystals of orthosilicates that use Tb or a rare earth element with an ion radius larger than that of Tb. It was also found that the effect of oxygen vacancies can be reduced without increasing the cracking of the crystals by adding a specific element to this system.

The inventors have also discovered that the elements with a valence of 4, 5, 6 that are described in Published Japanese translation of a PCT application No. 2001-524163 as elements effectively reducing oxygen deficiencies in single crystals of rare earth silicates do not necessarily demonstrate a sufficient effect in reducing the number of oxygen vacancies. Furthermore, the fluorescence output of the crystals comprising these elements is decreased by coloration and cracking of the crystal ingot is increased. In addition, it was found that most of the more than 50 elements from H to Th that are described in Published Japanese translation of a PCT application No. 2001-524163 to be effective in preventing the crystal from cracking when a scintillation element is cut and manufactured and for producing a waveguide characteristic in a waveguide element do not demonstrate an effect of reducing the influence of oxygen vacancies.

The inventors have discovered that the influence of oxygen vacancies in single crystals of orthosilicate compounds can be reduced more effectively if an element that belongs to Group 13 of the periodic table (referred to hereinbelow as "Group 13 element") that forms an oxide that has good stability at a high temperature close to the melting point, which corresponds to the conditions during crystal growth, and in a neutral environment such as argon atmosphere or an environment of nitrogen atmosphere is added to single crystals of specific cerium-activated orthosilicate compounds represented by general formulas (1), (2), (3) or (4) above. Further, it was established that because the addition of such Group 13 element to the aforementioned specific single crystals inhibits the change in valence of Ce ions even in an atmosphere comprising very small amount of oxygen, the generation of oxygen vacancies can be further reduced by adjusting the atmosphere when the single crystal is grown or heat treated after the growth.

Further, if a cerium-activated orthosilicate compound is heated at a temperature that is by 200° C. or less lower than the melting point of the crystal as described in Japanese Published Examined Patent Application No. 64-6160, then the fluorescence output decreases due to coloration of the crystal and absorption of fluorescence as disclosed in Japanese Patent No. 2,701,577. As a result, the temperature of 1000° C. or below that is a by more than 200° C. lower than the melting point of the crystal is not suitable, from the standpoint of practical use, as a temperature for heat treating the cerium-activated orthosilicate compounds in an atmosphere comprising oxygen.

Further, Japanese Patent Application Laid-open No. 2003-300795 relates to a single crystal having a composition different from the compositions represented by general formulas (1), (2), or (4) above, and the description of the application says nothing about the oxygen vacancies or background.

Japanese Patent Application Laid-open No. 9-142994 describes that if a raw material such as a rare earth oxide comprises 0.4 ppm or more of Al, the number of voids in the crystal increases and the scintillator characteristic is degraded. Further, Japanese Patent Application Laid-open No. 2004-59382 describes that the fluorescence decay time can be shortened, while maintaining the scintillator characteristic, by incorporating an extremely small amount of Al into the rare earth silicate crystals. However, nothing is said about the oxygen vacancies or background.

The present invention was created with the foregoing in view and it is an object thereof to provide a single crystal for a scintillator that is a single crystal of a cerium-activated orthosilicate compound having the composition represented by general formula (1), (2), or (4) above as a base composition, in particular a single crystal using at least one element selected from a group consisting of Dy, Ho, Er, Tm, Yb, Lu, Y, and Sc, which have an ion radius less than that of Tb, as the Ln, this single crystal having a sufficiently decreased background of fluorescence output and an excellent fluorescence characteristic.

The present invention provides a single crystal for a scintillator that is a single crystal of a cerium-activated orthosilicate compound represented by general formula (1) or (2) below that comprises 0.00005 to 0.1 wt. %, based on the entire weight of the single crystal, at least one element selected from a group consisting of elements belonging to Group 13 of the periodic table:

$$Y_{2-(x+y)}Ln_xCe_ySiO_5 \quad (1)$$

here, in formula (1), Ln denotes at least one element selected from a group consisting of elements belonging to rare earth elements, x is a numerical value of 0 to 2, and y is a numerical value of more than 0 and equal to or less than 0.2, $$Gd_{2-(z+w)}Ln_zCe_wSiO_5 \quad (2)$$

here, in formula (2), Ln denotes at least one element selected from a group consisting of elements belonging to rare earth elements, z is a numerical value of more than 0 and equal to or less than 2, and w is a numerical value of more than 0 and equal to or less than 0.2.

The present invention provides a single crystal for a scintillator that is a single crystal of a cerium-activated orthosilicate compound represented by general formula (3) below that comprises 0.00005 to 0.1 wt. %, based on the entire weight of the single crystal, at least one element selected from a group consisting of elements belonging to Group 13 of the periodic table:

$$Gd_{2-(p+q)}Ln_pCe_qSiO_5 \quad (3)$$

here, in formula (3), Ln denotes at least one element selected from a group consisting of Dy, Ho, Er, Tm, Yb, Lu, Y, and Sc, which are rare earth elements with an ion radius less than that of Tb, p is a numerical value of more than 0 and equal to or less than 2, and q is a numerical value of more than 0 and equal to or less than 0.2.

The present invention provides a single crystal for a scintillator that is a single crystal of a cerium-activated orthosilicate compound represented by general formula (4) below that comprises 0.00005 to 0.1 wt. %, based on the entire weight of the single crystal, at least one element selected from a group consisting of elements belonging to Group 13 of the periodic table:

$$Gd_{2-(r+s)}Lu_rCe_sSiO_5 \quad (4)$$

here, in formula (4), r is a numerical value of more than 0 and equal to or less than 2, and s is a numerical value of more than 0 and equal to or less than 0.2.

The present invention provides a single crystal for a scintillator, wherein at least one element selected from a group consisting of elements belonging to Group 13 of the periodic table is Al and/or Ga.

The present invention provides a method for manufacturing a single crystal for a scintillator, comprising a step of preparing a raw material in which at least one element selected from a group consisting of elements belonging to Group 13 of the periodic table is contained as a constituent element at 0.0002 to 0.4 wt. % based on the entire weight of the starting materials of the single crystal.

The present invention can provide a single crystal for a scintillator that is a single crystal of a cerium-activated orthosilicate compound having the composition represented by general formula (1), (2), or (4) above as a base composition, in particular a single crystal using at least one element selected from a group consisting of Dy, Ho, Er, Tm, Yb, Lu, Y, and Sc, which have an ion radius less than that of Tb, as the Ln, this single crystal having a sufficiently decreased background of fluorescence output and an excellent fluorescence characteristic.

DESCRIPTION OF THE PREFERRED EMBODIMENTS

Figure 1:
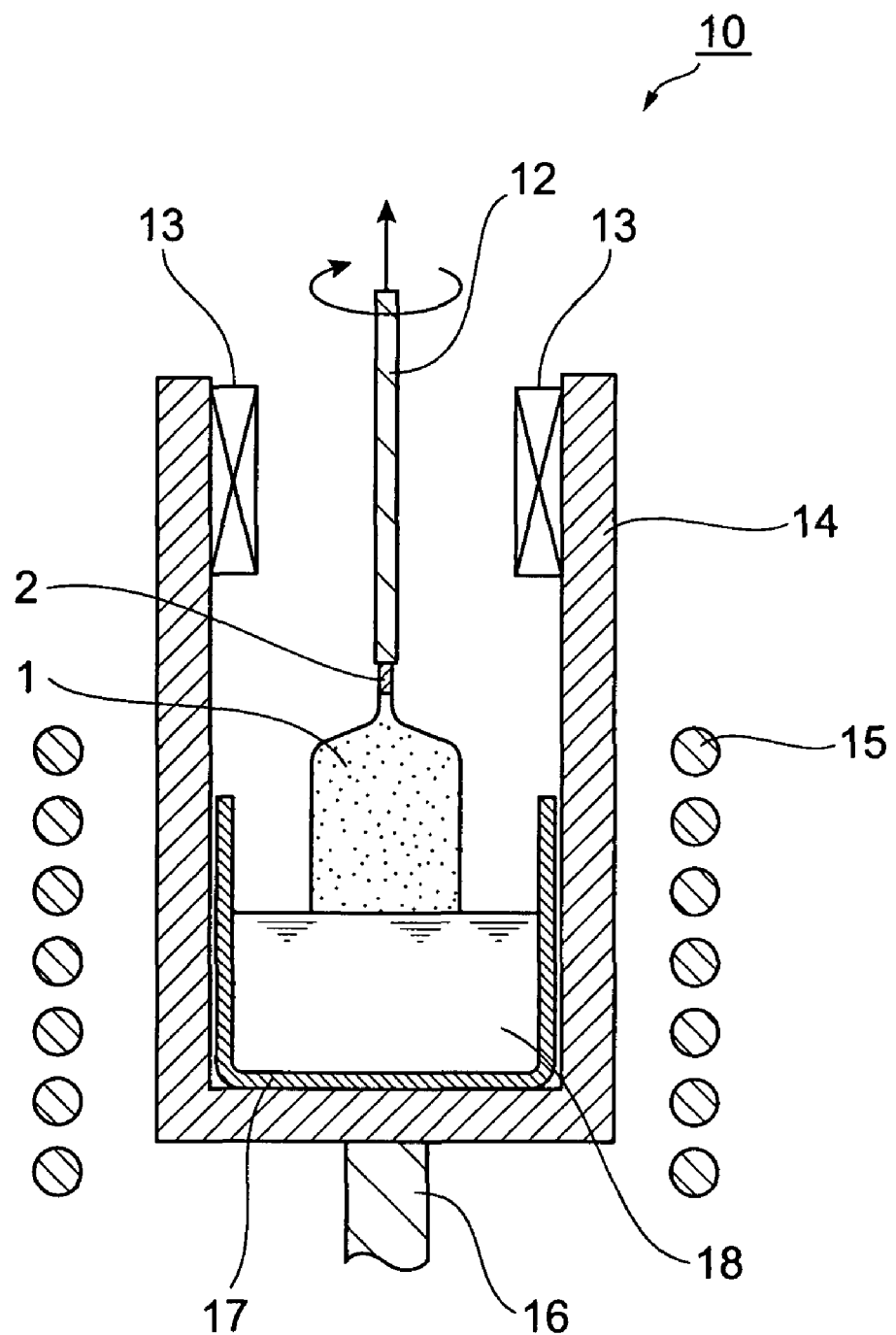
FIG. 1 is a schematic cross-sectional view illustrating an example of the basic configuration of the growing device for growing a single crystal.

The preferred embodiments of the present invention will be described below in greater detail, but they place no limitation on the scope of the present invention.

When single crystals of cerium-activated rare earth orthosilicate compounds are grown or heated in an atmosphere comprising oxygen, then trivalent cerium ions that are emission centers are changed into tetravalent ions. This change causes decrease in the number of emission centers and increase in fluorescence absorption caused by coloration of the crystals. As a result, the fluorescence output is known to decreases. This phenomenon becomes more pronounced if the oxygen concentration in the atmosphere increases or the heating temperature rises.

In single crystals of specific cerium-activated rare earth orthosilicate compounds, cerium ions are present in a trivalent state if the single crystals are grown or cooled in a neutral or reducing atmosphere with a low concentration of oxygen or in vacuum, or heated in a neutral or reducing atmosphere with a low concentration of oxygen or in vacuum. As a result, the coloration of crystals is sufficiently suppressed and the absorption of fluorescence caused by coloration is also sufficiently suppressed. This is apparently why a high fluorescence output can be obtained. Further, even if the fluorescence output of single crystals of cerium-activated rare earth orthosilicate compounds is decreased due to growing or cooling in an atmosphere comprising oxygen or heating in an atmosphere comprising oxygen, subsequent heat treatment in an atmosphere with a low concentration of oxygen returns tetravalent cerium ions to a trivalent state, thereby causing the increase in the number of emission centers and decrease in crystal coloration. This is known to increase the fluorescence output due to the increase in transmissivity of the single crystals. This phenomenon becomes more pronounced if the oxygen concentration in the atmosphere is low, and also if the concentration of a reducing gas such hydrogen in the atmosphere is high and the heating temperature is high.

The aforementioned growth of crystals in an atmosphere with a low concentration of oxygen and heat treatment at a high temperature were actually confirmed to provide for good fluorescence characteristics and to improve the fluorescence characteristics in single crystals of $Gd_{2(1-x)}Ce_{2x}SiO_5$ (cerium-activated gadolinium orthosilicate) and the like. For example, a method comprising a step of heat treating at a high temperature (a temperature 50 to 550° C. lower than the melting point of the single crystals) in an atmosphere with a low concentration of oxygen is disclosed in Japanese Patent No. 2,701,577 as a method for heat treating a single crystal of cerium-activated gadolinium orthosilicate.

However, in the case of single crystals of cerium-activated orthosilicate compound represented by general formula (1) above and single crystals of cerium-activated gadolinium orthosilicate represented by general formula (2) or (4) above, in particular in the case of single crystals using at least one element selected from a group consisting of Dy, Ho, Er, Tm, Yb, Lu, Y, and Sc, which have an ion radius less than that of Tb, as the Ln, the aforementioned growth or cooling of the single crystals in a neutral or reducing atmosphere with a low concentration of oxygen or in vacuum or heat treatment in a neutral or reducing atmosphere with a low concentration of oxygen or in vacuum was found to produce a negative effect by increasing the background of fluorescence output and increasing the spread in fluorescent output. This effect becomes even more significant if the concentration of oxygen in the atmosphere is low, the concentration of a reducing gas such as hydrogen in the atmosphere is high, and the heating temperature is high.

One of the reasons is that when the single crystals are grown or heat treated in an atmosphere with a low concentration of oxygen, oxygen vacancies are apparently generated inside the crystal lattice. Voids created by oxygen vacancies result in the formation of energy trap levels, the background of fluorescence output increases owing to thermal excitation from this level, and the spread of fluorescence output also increases. The fluorescence output background created by this thermal excitation is generally called "afterglow."

The number of oxygen vacancies in single crystals of the aforementioned cerium-activated orthosilicate compounds tends to decrease if the single crystals are grown in an atmosphere comprising a large amount of oxygen. However, because growing of single crystals in an atmosphere comprising a large amount of oxygen changes the valence of cerium ions from 3 ($Ce^{3+}$) to 4 ($Ce^{4+}$), the transmissivity of emission wavelength decreases causing the decrease in fluorescence output. Furthermore, most orthosilicate single crystals have an extremely high melting point of 1600° C. and higher. Single crystals of orthosilicates are generally grown by a Czochralski method based on high-frequency heating using an Ir crucible, but if an Ir crucible is exposed to an atmosphere comprising oxygen at a high temperature of 1500° C. or higher, evaporation of Ir becomes significant, thereby inhibiting the crystal growth. Because of these two problems, the single crystals of cerium-activated orthosilicates are mostly grown in a neutral or reducing atmosphere with a low concentration of oxygen. A problem resulting therefrom is that oxygen vacancies are easily generated in the crystal growth step.

Voids induced by oxygen vacancies tend to appear easily in crystal compositions in cerium-activated orthosilicate compounds in which the crystal structure easily becomes a C2/c structure. In single crystals of cerium-activated orthosilicate compound represented by general formula (1) above and single crystals of cerium-activated gadolinium orthosilicate represented by general formula (2) or (4) above, if at least one element selected from a group consisting of La, Pr, Nd, Pm, Sm, Eu, Ga, and Tb, which are elements having an ion radius larger than that of Dy, is used as the Ln in the formulas, the crystal structure easily becomes a $P2_1/c$ structure. On the other hand, if at least one element selected from a group consisting of Dy, Ho, Er, Tm, Yb, Lu, Y, and Sc, which have an ion radius less than that of Tb, is used as the Ln in the formulas, the crystal structure easily becomes a C2/c structure. The aforementioned increase in the afterglow of fluorescence output and spread in fluorescence output easily occur in the crystals in which the crystal structure easily becomes a C2/c structure. This is apparently because the aforementioned oxygen vacancies are easily generated when the difference between the ion radius of Ce that is an activator and the ion radius of the elements of the orthosilicate compound becomes large.

In the case of single crystals of cerium-activated gadolinium orthosilicate compound represented by general formula (3), the oxygen vacancies tend to be generated easier as the content ratio of Ln with a small ion radius increases. In the single crystals cerium-activated orthosilicate compounds in which oxygen vacancies are generated easily due to the aforementioned crystal composition, the oxygen vacancies are apparently generated easily even when heating is conducted in a neutral atmosphere or a neutral or reducing atmosphere with a very low concentration of oxygen or even when heating is conducted at a lower temperature.

Further, in the $Lu_{2(1-x)}Ce_{2x}SiO_5$ (cerium-activated lutetium orthosilicate), which has a C2/c crystal structure, the difference in ion radius with Ce ion is also large and, therefore, the oxygen vacancies are generated easily.

In the above-described single crystals of cerium-activated orthosilicate compounds, if the difference in the ion radius between Ce and the constituent rare earth element increases, when crystal growth is performed by a Czochralski method, the segregation coefficient of Ce from the crystal melt into the crystal is greatly decreased. This is apparently why a spread in Ce concentration easily occurs in the crystal ingot and this spread can become a cause for the spread in the afterglow or fluorescence output of the crystal.

As for the concentration of Ce in the single crystal for a scintillator in accordance with the present invention, the numerical values of y, w, q, and s in general formulas (1), (2), (3), and (4) above are more than 0 and not more than 0.2. Furthermore, it is preferred that these numerical values be 0.0001 to 0.02, most preferably 0.0005 to 0.005. When the numerical values are zero, Ce that is an activator is not present. Therefore, the emission levels are not formed and no fluorescence can be obtained. On the other hand, when the numerical values exceed 0.2, the amount of Ce incorporated into the crystals reaches saturation and the effect of Ce addition is reduced. Furthermore, voids and defects caused by segregation of Ce occur and the fluorescence characteristics tend to degrade.

Upon investigating the additives that can suppress the degradation of fluorescence output caused by the generation of oxygen vacancies, thereby increasing the fluorescence output, the inventors have found that elements belonging to Group 13 of the periodic table (sometimes referred to hereinbelow as "Group 13 element") are effective. Among such elements, Al and/or Ga that has an ion radius close to that of rare earth elements and Si are especially effective in compositions represented by general formulas (1), (2), (3), and (4).

Upon investigating the additives that can suppress the degradation of fluorescence output caused by the generation of oxygen vacancies, thereby increasing the fluorescence output, the inventors have found that elements that can be present as stable oxides under temperature conditions and in the atmosphere of crystal growth are effective. Accordingly, the inventors computed a diagram of elements M (M-N—O system) by using a computational software for chemical reactions and equilibrium states (product name "HSC Chemistry for Windows (registered trade mark): Chemical Reaction and Equilibrium Software with Extensive Thermochemical Database", Outokumpu Research Oy.) with respect to an oxidation state of the element in the vicinity of single crystal growth conditions for orthosilicate compounds. A critical oxygen partial pressure at which the element can be present as a stable oxide, without being reduced, in a nitrogen atmosphere under 1 atm and at a temperature of 2000° C., which is close to a melting point of single crystals of orthosilicates (this partial pressure is obtained using the computational software), apparently corresponds to the easiness of the element presence as an oxide under the crystal growth conditions. Thus, when a numerical value of ΔG in an oxidation reaction represented by general formula (9) below under the above-described crystal growth conditions becomes large on the minus side, the element apparently can be easily present as an oxide under such conditions.

$$M + xO_2 \rightarrow MO_{2x} \qquad (9)$$

wherein M is an element, and x is a coefficient.

The results of computations performed with the aforementioned computational software demonstrated that at least one element that is present as an oxide in a nitrogen atmosphere at 2000° C. under a pressure of 1 atm and at an oxygen partial pressure close to $1 \times 10^{-14}$ atm and below can be advantageously used in accordance with the present invention.

Examples (in addition to rare earth elements) of the elements that are present as stable oxides at a temperature of 2000° C. in a nitrogen atmosphere under a pressure of 1 atm and at an oxygen partial pressure within a range of $1 \times 10^{-12}$ atm to $1 \times 10^{-14}$ atm include Ra, Zr, Hf, Mo, Al, Be, Mg, Ca, Sr, Ba, Ga, Ta, Li, and Sc. These elements, which can be present as oxides even under an ultralow partial pressure of oxygen at a high temperature close to 2000° C., are the elements that easily react with oxygen. Therefore, the inventors guess that they are bonded with oxygen present in the single crystal and inhibit the desorption of oxygen ions from the single crystal. At the same time, they are apparently bonded to an extremely small quantity of residual oxygen present in the growth atmosphere, thereby incorporating oxygen into the single crystal. This is apparently why the generation of oxygen vacancies in the single crystals of orthosilicates can be inhibited even when the single crystals are exposed to a high temperature in an atmosphere with a low concentration of oxygen. Furthermore, since the reaction of oxygen with Ce ions is suppressed, the valence of Ce ions is prevented from changing from 3 to 4. For this reason, in the single crystal growth or during heat treatment after the growth, the valence of Ce ions hardly changes even if an extremely small amount of oxygen is mixed with the atmosphere. Therefore, the generation of oxygen vacancies can be reduced also by adjusting the concentration of oxygen in the atmosphere. However, the causal relation to the effect produced by the above-described elements in accordance with the present invention is not limited to the aforementioned action.

The aforementioned effect produced by the addition of an element belonging to Group 2 of the periodic table has already been described in the specification of Japanese Patent Application No. 2005-262568 filed by the inventors, but the demonstration of a similar effect by an element belonging to Group 13 of the periodic table is a new discovery. Further, the specification of Japanese Patent Application No. 2005-262568 also describes that from amongst the elements that are present as stable oxides even under an oxygen partial pressure within a range of $1 \times 10^{-12}$ atm to $1 \times 10^{-14}$ atm, the elements belonging to Groups 4, 5, 6, 14, 15, and 16, for example, Zr, Hf, Mo, and Ta act to cause the coloration of crystals and decrease in fluorescence output.

The concentration of the Group 13 element in the orthosilicate single crystal in accordance with the present invention is preferably 0.00005 to 0.1 wt. % based on the total weight of the crystal, more preferably 0.0001 to 0.05 wt. %, and most preferably 0.0005 to 0.01 wt. %. When this concentration is less than 0.00005 wt. %, the addition of the Group 13 element produces hardly any effect. When the concentration is more than 0.1 wt. %, the addition of the Group 13 element increases lattice voids and crystal strains, increases the number of polycrystals and cracks, and makes the crystal growth difficult. Furthermore, because non-emitting levels are formed due to the lattice voids, the fluorescence output tends to decrease.

A method for manufacturing the single crystal for a scintillator in accordance with the present invention may be performed according to the usual method for manufacturing a single crystal of an orthosilicate compound, with the exception of using a starting material comprising a Group 13 element as a constituent element. When a starting material for a single crystal is prepared, the aforementioned Group 13 element is preferably added in an amount of 0.0002 to 0.4 wt. % to the starting material. The Group 13 element that was added is incorporated into the single crystal based on a dispersion coefficient (segregation coefficient) from a starting material melt into the crystal that is apparently influenced by the difference in ion radius between this element and the rare earth element present in the base crystal of the single crystal of an orthosilicate compound in accordance with the present invention. Because the dispersion coefficient is less than 1, the concentration of the Group 13 element present in the single crystal tends to be lower than the amount of the element added to the starting material.

Further, the ion radius of the Group 13 element present in the single crystal of an orthosilicate compound apparently affects the effect of reducing the number of oxygen vacancies. The below-described ion radius is cited from a homepage of the Earth Resources Research Laboratory of the Hiroshima University. (http://home.hiroshima-u.ac.jp/er/Min_G2.html, Jun. 8, 2005) Empirical radii obtained by Shannon and Prewitt (1969, 70), some being obtained by Shannon (1976), and some being estimated values obtained by Pauling (1960) or Ahrens (1952) were directly employed.

In the single crystal of the orthosilicate compound in accordance with the present invention, the Group 13 element is apparently present not only in the locations of rare earth elements such as Ce, Lu, Y, and Gd, but also in the locations of Si element and in the interstitial locations. In particular, when the Group 13 element is present by substituting Si in the crystal lattice, the elements having an ion radius close to the ion radius of the element in the base crystal (40 pm for Si; here, 1 pm=0.01 Å) can be easier substituted into the lattice positions of Si element. Therefore, the substitution element significantly improves the fluorescence output.

In the Group 13 elements, the ion radius gradually increases in the following order: B (iron radius: 12 pm), Al (iron radius: 53 pm), Ga (iron radius: 62 pm), In (iron radius: 80 pm), Ti (iron radius: 150 pm). The effect of improving the fluorescence output in accordance with the present invention can be demonstrated even more efficiently if from these elements, Al and/or Ga, which has the ion radius close to that of Si of the base crystal, is added to the base crystal. In particular, if Al, which has the ion radius closest to that of Si, is added to the base crystal, the Al is easily incorporated into the crystal and the effect of improving the fluorescence output in accordance with the present invention can be demonstrated with a very high efficiency.

On the other hand, the elements with a valence of 4, 5 and 6 that are described in Published Japanese translation of a PCT application No. 2001-524163 as the addition elements demonstrating an effect of reducing the number of oxygen vacancies in the single crystals of rare earth silicates are hardly present as stable oxides in the above-described high-temperature growth atmosphere with a low concentration of oxygen. Therefore, these elements, by contrast with the Group 13 elements, can be present as oxides only in the environment having a higher partial pressure of oxygen. As a result, when such elements are added, the effect of reducing the number of oxygen vacancies and the effect of suppressing the change in the valence of Ce ions are not sufficient. Moreover, the inventors have discovered that such an addition rather increases the number of cracks in the crystal ingot. Further, the elements with a valence of 4, 5 and 6 that are described in Published Japanese translation of a PCT application No. 2001-524163 were found to cause the coloration of crystal and to decrease the fluorescence output.

When the single crystal of cerium-activated orthosilicate in accordance with the present invention is grown or cooled in a neutral or reducing atmosphere with a low concentration of oxygen or in vacuum, the density of oxygen vacancies easily increases. Therefore, the aforementioned effect of the present invention is demonstrated even more efficiently. Further, in the single crystals of the compounds represented by general formulas (1) and (2), the effect of the present invention can be demonstrated even more efficiently if the crystal structure becomes of a C2/c type and if Ln has a high ratio of at least one element selected from a group consisting of Dy, Ho, Er, Tm, Yb, Lu, Y, and Sc, which have an ion radius less than that of Tb and a large difference in ion radius with cerium.

A method for manufacturing a single crystal for a scintillator of a preferred embodiment of the present invention will be described below. The method for manufacturing a single crystal for a scintillator comprises a raw material preparation step in which a raw material is prepared that comprises as a constituent element at least one element selected from a group consisting of Group 13 elements, a growth step in which a single crystal is grown from the prepared raw material, and a heating step in which the single crystal ingot obtained by the growth step is heat treated under the predetermined conditions.

In the raw material preparation step, a raw material comprises a mixture obtained by adding a Group 13 element to constituent elements of the base crystal. The constituent elements of the base crystal are prepared in a state of oxides (individual oxides or complex oxides) or salts (single salts or complex salts) such as carbonates and are in a state, for example, of a solid powder. The Group 13 element is preferably added in an amount of 0.0002 to 0.4 wt. % based on the entire weight of the single crystal raw material. No specific limitation is placed on the timing at which the Group 13 element is added, provided that the element is added before the crystal is grown. Thus, the Group 13 element may be added to and mixed with the raw material when the raw material is weighed, or the Group 13 element may be admixed when the raw material is charged into a crucible. Further, no specific limitation is placed on the form of the Group 13 element at the time of addition, provided that the element can be contained in the grown single crystal. For example, the element may be added in the form of an oxide or a carbonate to the raw material.

The growth step further comprises a melting step for obtaining a molten liquid in which the above-described prepared raw materials are converted to a molten state by a melting method and a cooling and solidification step for obtaining a single crystal ingot by cooling and solidifying the molten liquid.

The melting method in the aforementioned melting step may be a Czochralski method. In this case, the operations in the melting step and the cooling and solidification step are preferably carried out by using a pulling device 10 having a structure shown in FIG. 1.

FIG. 1 is a schematic cross-sectional view illustrating an example of a basic configuration of a growth device for growing the single crystal in accordance with the present invention. The pulling device 10 shown in FIG. 1 has a high-frequency induction heating furnace (two-zone heating growth furnace) 14. The high-frequency induction heating furnace 14 serves to perform continuously the operations in the above-described melting step and cooling and solidification step.

The high-frequency induction heating furnace 14 is an open-end container with a fire-resistant cylindrical side wall, and the shape of the open-end container itself is identical to that used for the conventional growth of single crystals by a Czochralski method. A high-frequency induction coil 15 is wound about the side surface in the bottom section of the high-frequency induction heating furnace 14. A crucible 17 (for example, a crucible made from Ir) is disposed on the bottom surface inside the high-frequency induction heating furnace 14. The crucible 17 also serves as a high-frequency induction heater. Further, if raw materials for the single crystal are charged into the crucible 17 and a high-frequency current is induced in the high-frequency induction coil 15, the crucible 17 is heated and a molten liquid 18 (melt) composed of the constituent materials of the single crystal is obtained.

Further, an opening (not shown in the figure) passing from the inside of the high-frequency induction heating furnace 14 to the outside is provided in the center of the bottom section of the high-frequency induction heating furnace 14. A crucible support rod 16 is inserted from the outside of the high-frequency induction heating furnace 14 through the opening, and the distal end of the crucible support rod 16 is connected to the bottom section of the crucible 17. By rotating the crucible support rod 16, the crucible 17 can be rotated inside the high-frequency induction heating furnace 14. The space between the opening and the crucible support rod 16 is sealed with a packing or the like.

A more specific method for manufacturing a single crystal by using the pulling device 10 will be described above.

First in the melting step, the raw materials for a single crystal are charged into the crucible 17 and a high-frequency current is induced in the high-frequency induction coil 15, whereby the molten liquid 18 (melt) composed of the constituent materials of the single crystal is obtained. Examples of suitable raw materials for the single crystal include individual oxides and/or composite oxides of the metal elements that will constitute the single crystal. Examples of preferred commercial materials include raw materials with a high degree of purity that are manufactured by Shin-Etsu Chemical Co., Ltd., Stanford Material Co., and Tama Chemical Co., Ltd.

A cylindrical rod-like single crystal ingot 1 is then obtained by cooling and solidifying the molten liquid in the cooling and solidification step. More specifically, the operations are carried out by dividing the process into two below-described steps: a crystal growth step and a cooling step.

First, in the crystal growth step, a pulling rod 12 having a seed crystal 2 fixed to the lower distal end thereof is charged into the molten liquid 18 from above the high-frequency induction heating furnace 14. Then, the single crystal ingot 1 is formed, while the pulling rod 12 is pulled up. At this time, in the crystal growth process, the heating output of a heater 13 is adjusted and the single crystal ingot 1 that is pulled up from the molten liquid 18 is grown until the cross-sectional diameter thereof assumes a predetermined value.

Then, in the cooling step, the heating output of the heater is adjusted and the grown single crystal ingot (not shown in the figures) that is obtained after the crystal growth step is cooled.

Then, in the heating step, the ingot of the cerium-activated orthosilicate single crystal in accordance with the present invention that was obtained via the growth step is subjected to heat treatment under the predetermined conditions. The heat treatment may be a process described in the specification of Japanese Patent Application No. 2005-155874 or the specification of Japanese Patent Application No. 2005-155871. More specifically, the single crystal may be treated by heating at a temperature of, for example, 300 to 1500° C., preferably 500 to 1500° C., even more preferably 700 to 1300° C. in an atmosphere comprising oxygen (for example, an atmosphere with an oxygen concentration of 100 vol. %, or an atmosphere comprising nitrogen or inert gas in which the concentration of oxygen is 1 vol. % or more to less than 100 vol. %), then replacing the atmosphere with an atmosphere with a small concentration of oxygen, while maintaining the heating temperature, raising the heating temperature, and further heating the single crystal at a heating temperature $T_a$ (units: ° C.) satisfying the conditions represented by formula (5) below.

$$500 \leq T_a < (T_m - 550) \quad (5)$$

In formula (5), $T_m$ (units: ° C.) denotes a melting point of the single crystal.

The single crystal of the cerium-activated orthosilicate in accordance with the present invention may be also treated by heating at a heating temperature $T_b$ (units: ° C.) satisfying the conditions represented by formula (6) below in an atmosphere with a low concentration of oxygen (for example, an atmosphere with a total concentration of argon and nitrogen of 80 vol. % or more, a concentration of oxygen of less than 0.2 vol. %, and if necessary a concentration of hydrogen gas of 0.5 vol. % or more), then replacing the atmosphere with the aforementioned atmosphere comprising oxygen, and heating the single crystal at a heating temperature of 300 to 1500° C. in this atmosphere:

$$800 \leq T_b < (T_m - 550) \quad (6)$$

in formula (6), $T_m$ (units: ° C.) denotes a melting point of the single crystal.

Performing such heat treatments makes it possible to reduce further the number of oxygen vacancies formed in the single crystal.

Further, the ingot of the cerium-activated orthosilicate single crystal in accordance with the present invention that was obtained via the growth step may be heated at a temperature $T_3$ (units: ° C.) satisfying the conditions represented by formula (7) below in an atmosphere with a low concentration of oxygen (for example, an atmosphere with a total concentration of argon and nitrogen of 80 vol. % or more, a concentration of oxygen of less than 0.2 vol. %, and if necessary a concentration of hydrogen gas of 0.5 vol. % or more). By performing this heat treatment, the increase in the number of oxygen vacancies in the crystal can be suppressed, and furthermore the change to $Ce^{3+}$ from $Ce^{4+}$ can be performed efficiently:

$$800 \leq T_3 < (T_{m3} - 550) \quad (7)$$

in formula (7), $T_{m3}$ (units: ° C.) denotes a melting point of the single crystal.

In the method for manufacturing a single crystal for a scintillator in accordance with the present invention, the above-described heating step may be omitted.

The present invention relates to the above-described single crystal of cerium-activated orthosilicate that has improved scintillator characteristics such as the fluorescence output, fluorescence output afterglow, and energy resolution, and to a method for manufacturing such single crystal. The valence state of cerium ions in the single crystal of cerium-activated orthosilicate greatly affects the fluorescence output. A change from a state of trivalent cerium ions, which are the emission centers, to a state of tetravalent cerium ions, which are non-emission centers and induce coloration and fluorescence absorption, occurs due to heating in an atmosphere comprising oxygen. For this reason, the single crystal growth is performed in a neutral or reducing atmosphere with a low concentration of oxygen or in vacuum. However, when the single crystal is grown under such conditions, oxygen vacancies are generated in the single crystal. Oxygen vacancies generated in the single crystal greatly affect the background intensity of fluorescence output and increase the spread of fluorescence inside the crystal ingot, between the ingots, during the day, and such as caused by illumination with natural light comprising ultraviolet radiation. These oxygen vacancies are apparently caused by crystal growth and/or cooling in an atmosphere with a low concentration of oxygen and at a high temperature comparatively close to the melting point of the crystals, or by the heat treatment. It was found that because the single crystal comprises the Group 13 element that is present as a stable oxide in the crystal even in an atmosphere with a low concentration of oxygen and a high temperature close to the growth conditions of the single crystal and that is apparently easily substituted not only into the locations of rare earth elements in the above-described cerium-activated orthosilicate single crystals, but also in the lattice locations of Si, the effect of oxygen vacancies can be inhibited and the fluorescence output characteristic can be improved. This finding led to the creation of the present invention.

EXAMPLES

The present invention will be explained below in greater detail based on examples thereof, but the present invention is not limited to these examples.

Example 1

A single crystal was produced based on the well-known Czochralski method. First, gadolinium oxide ($Gd_2O_3$, purity 99.99 wt. %), lutetium oxide ($Lu_2O_3$, purity 99.99 wt. %), silicon dioxide ($SiO_2$, purity 99.9999 wt. %) and cerium oxide (CeO$_2$, purity 99.99 wt. %) were mixed to obtain a predetermined stoichiometric composition, and a mixture, 500 g, was fed as a raw material for a single crystal Gd$_{2-(r+s)}$Lu$_r$Ce$_s$SiO$_5$ (r=1.8, s=0.003) together with 0.02244 g (equivalent to 0.0024 wt. % of Al) of aluminum oxide (Al$_2$O$_3$, purity 99.99 wt. %) into an Ir crucible with a diameter of 50 mm, a height of 50 mm, and a thickness of 2 mm. Molted liquid was obtained by heating the mixture to its melting point (approximately 2050° C.) in a high-frequency induction heating furnace. The melting point was measured with an electronic optical pyrometer (manufactured by Chino KK, Pyrostar MODEL UR-U, product name).

Seeding was then performed by inserting a distal end of a pulling rod having a seed crystal fixed to the distal end into the molted liquid. The pulling rod was then pulled up at a pulling rate of 1.5 mm/h and a neck portion of a single crystal was formed. The pulling rod was then pulled and a cone portion of the single crystal was formed. The pulling of the rod for forming straight cylindrical body at a pulling rate of 1 mm/h was started from the point in time in which the diameter of the cone portion became 25 mm. After the straight cylindrical body has been grown, the single crystal ingot was separated from the melt and cooling was started. When the crystal was grown, N$_2$ gas at a flow rate of 4 L/min and O$_2$ gas at a flow rate of 10 mL/min were continuously blown into the growth furnace.

Upon completion of cooling, the single crystal obtained was removed. The obtained single crystal ingot had a crystal weight of about 250 g, a cone portion length of about 30 mm, and a straight body length of about 70 mm.

A plurality of crystal samples in the form of rectangular parallelepipeds of 4 mm×4 mm×22 mm were cut out from the obtained single crystal ingot. The cut-out crystal samples were chemically etched using phosphoric acid, and the entire surface of the crystal samples was mirror finished.

Two crystal samples were sampled at random from the mirror-finished crystal samples. From among the six planes of the crystal samples in the form of rectangular parallelepipeds of 4 mm×4 mm×22 mm, five planes were covered with a polytetrafluoroethylene (PTFE) tape as a reflecting material, and one plane with a size of 4 mm×4 mm (referred to hereinbelow as "radiation incidence plane") was left uncovered. The radiation incidence plane, which was not covered with the PTFE tape, of each obtained sample was fixed using an optical grease to a photomer plane (photoelectric conversion plane) of a photoelectronic multiplier (R878, manufactured by Hamamatsu Photonics Co., Ltd.). Each sample was then irradiated with gamma radiation of 662 KeV using $^{137}$Cs and the energy spectrum of each sample was measured. The fluorescence output, energy resolution, and afterglow of each sample were evaluated. The energy spectrum was measured with MCA (manufactured by PGT Co., Ltd., product name "Quantum MCA4000") by applying a voltage of 1.45 kV to the photoelectronic multiplier and amplifying a signal from the dynode with a preamplifier (manufactured by ORTEC Co., Ltd., product name "113") and a waveform shaping amplifier (manufactured by ORTEC Co., Ltd., product name "570"). The results are shown in Table 1.

TABLE 1

| | Crystal composition | Additional element/ concentration (wt. %) | Trivalent additional element/ concentration (wt. %) | Fluorescence output (ch) | Energy resolution (%) | Afterglow (mV) |
|---|---|---|---|---|---|---|
| Example 1 | Gd$_{2-(r+s)}$ Lu$_r$Ce$_s$SiO$_5$ (r = 1.8, s = 0.003) | None | Al/ 0.0024 | 1240.5 1245.8 | 9.53 9.24 | 0 0 |
| Example 2 | | | Al/ 0.0048 | 1256.3 1232.6 | 9.37 9.73 | 0 0 |
| Example 3 | | | Al/ 0.048 | 1140 1152.9 | 17.5 17.1 | 0 0 |
| Example 4 | | | Ga/ 0.0061 | 1192.3 1187.3 | 11 9.54 | 0 0 |
| Example 5 | | | Ga/ 0.0122 | 1287.1 1288.2 | 8.9 9.31 | 0 0 |
| Example 6 | | Ca/0.0071 | Al/ 0.0024 | 1344.5 1315.9 | 8.75 9.68 | 0 0 |
| Comparative Example 1 | | None | None | 880 1035 | 14 13.4 | 30 20 |
| Comparative Example 2 | | | Al/ 0.24 | Significant number of voids, does not deserve evaluation | | |
| Comparative Example 3 | Gd$_{2-(r+s)}$ Lu$_r$Ce$_s$SiO$_5$ (r = 0, s = 0.0145) | None | Al/ 0.0024 | 198 | 14 | 0 |
| Comparative Example 4 | | | None | 330 | 10 | 0 |

Example 2

This example was identical to Example 1, except that 0.0224 g of aluminum oxide (Al$_2$O$_3$, purity 99.99 wt. %) was changed to 0.0449 g (equivalent to 0.0048 wt. % as Al).

Example 3

This example was identical to Example 1, except that 0.0224 g of aluminum oxide (Al$_2$O$_3$, purity 99.99 wt. %) was changed to 0.4488 g (equivalent to 0.048 wt. % as Al).

Example 4

This example was identical to Example 1, except that 0.0224 g of aluminum oxide (Al$_2$O$_3$, purity 99.99 wt. %) was changed to 0.04125 g (equivalent to 0.0061 wt. % as Ga) of gallium oxide (Ga$_2$O$_3$, purity 99.99 wt. %).

Example 5

This example was identical to Example 1, except that 0.0224 g of aluminum oxide (Al$_2$O$_3$, purity 99.99 wt. %) was changed to 0.08250 g (equivalent to 0.0122 wt. % as Ga) of gallium oxide ($Ga_2O_3$, purity 99.99 wt. %).

Example 6

This example was identical to Example 1, except that 0.0224 g of aluminum oxide ($Al_2O_3$, purity 99.99 wt. %) was changed to 0.08881 g (equivalent to 0.0071 wt. % as Ca) of calcium carbonate ($CaCO_3$, purity 99.99 wt. %).

Comparative Example 1

This comparative example was identical to Example 1, except that no aluminum oxide was used.

Comparative Example 2

This example was identical to Example 1, except that 0.0224 g of aluminum oxide ($Al_2O_3$, purity 99.99 wt. %) was changed to 2.224 g (equivalent to 0.24 wt. % as Al).

Comparative Example 3

This comparative example was identical to Example 1, except that r and s were 0 and 0.0145, respectively, in the crystal composition and 0.0224 g of aluminum oxide ($Al_2O_3$, purity 99.99 wt. %) was changed to 0.0241 g (equivalent to 0.0024 wt. % as Al).

Comparative Example 4

This comparative example was identical to Example 1, except that r and s were 0 and 0.0145, respectively, in the crystal composition and aluminum oxide ($Al_2O_3$, purity 99.99 wt. %) was not added.

Similarly to Example 1, the results relating to the fluorescence output, energy resolution, and afterglow of crystal samples of Examples 2 to 6 and Comparative Examples 1 to 4 are shown in Table 1. The above-described examples illustrate preferred examples and place no limitation on the present invention.

Although in Examples 1 to 6 and Comparative Examples 1 to 4 the growth was performed in an atmosphere comprising oxygen, the crystals of Examples 1 to 6, which comprised a predetermined amount of Group 13 elements forming stable oxides in a low-oxygen concentration region at a temperature of 2000° C., which was close to the crystal growth conditions, had a good fluorescent characteristic with a low afterglow. This is apparently because in crystals having the predetermined amount of Group 13 element added thereto, the valence of Ce ions is prevented from changing, whereby the generation of oxygen vacancies is reduced and the decrease in fluorescence output caused by the change in valence of Ce ions is prevented.

In Example 4, the fluorescence output and energy resolution are decreased with respect to those of Examples 1 to 3 apparently because the additive is added in excess of the optimum amount. However, the afterglow is low similarly to Examples 1 to 3, and the effect of stabilizing the characteristics by adding a Group 13 element is still obtained.

Further, the addition of at least one element selected from the Group 2 of the periodic table, as described in the specification of Japanese Patent Application No. 2005-171300 that was earlier filed by the inventors, to the single crystals of cerium-activated orthosilicates in accordance with the present invention also demonstrates a similar effect. In Example 6, both a Group 13 element and at least one element selected from the Group 2 of the periodic table were added, and good fluorescence characteristics were obtained. Thus, the fluorescence output and energy resolution were good and afterglow was low.

In Comparative Example 1, because no Group 13 element was added, oxygen vacancies were introduced during crystal growth, the afterglow increased, and spread of characteristics also increased.

In Comparative Example 2, Al selected from the Group 13 elements was added in excess. As a result, a very large number of voids appeared during crystal growth. Because the external appearance was unsatisfactory for a product, the crystals did not deserve evaluation. A spread in characteristic apparently was large due to the effect of voids.

In Comparative Examples 3, 4, crystals with r=0 were grown. When Al was added thereto as a Group 13 element (Comparative Example 3), the fluorescence output decreased by comparison with that of the crystal without the additive (Comparative Example 4). When r=0, the crystal had a $P2_1/c$ structure that was difference from the C2/c structure of crystals in Examples 1 to 6. In the structure $P2_1/c$, oxygen vacancies hardly occurred. As a result, the effect of reducing the number of oxygen vacancies could be obtained even when the Group 13 element was added. Moreover, the vacancies became a cause for heterogeneity of the crystal, e.g., induced the generation of voids. This is apparently why the characteristic of Comparative Example 3 decreased with respect to that of Comparative Example 4.

What is claimed is:

1. A single crystal for a scintillator that is a single crystal of a cerium-activated orthosilicate compound, represented by general formula (1) or (2) below, that comprises 0.00005 to 0.1 wt. %, based on the entire weight of said single crystal, of at least one element selected from a group consisting of elements belonging to Group 13 of the periodic table:

$$Y_{2-(x+y)}Ln_xCe_ySiO_5 \qquad (1)$$

wherein Ln denotes at least one element selected from a group consisting of elements belonging to rare earth elements, x is a numerical value of 0 to 2, and y is a numerical value of more than 0 and equal to or less than 0.2;

$$Gd_{2-(z+w)}Ln_zCe_wSiO_5 \qquad (2)$$

wherein Ln denotes at least one element selected from a group consisting of elements belonging to rare earth elements, z is a numerical value of more than 0 and equal to or less than 2, and w is a numerical value of more than 0 and equal to or less than 0.2.

2. A single crystal for a scintillator that is a single crystal of a cerium-activated orthosilicate compound, represented by general formula (3) below, that comprises 0.00005 to 0.1 wt. %, based on the entire weight of said single crystal, of at least one element selected from a group consisting of elements belonging to Group 13 of the periodic table:

$$Gd_{2-(p+q)}Ln_pCe_qSiO_5 \qquad (3)$$

wherein Ln denotes at least one element selected from a group consisting of Dy, Ho, Er, Tm, Yb, Lu, Y, and Sc, which are rare earth elements with an ion radius less than that of Tb, p is a numerical value of more than 0 and equal to or less than 2, and q is a numerical value of more than 0 and equal to or less than 0.2.

3. A single crystal for a scintillator that is a single crystal of a cerium-activated orthosilicate compound, represented by general formula (4) below, that comprises 0.00005 to 0.1 wt. %, based on the entire weight of said single crystal, of at least one element selected from a group consisting of elements belonging to Group 13 of the periodic table:

$$Gd_{2-(r+s)}Lu_rCe_sSiO_5 \qquad (4)$$

wherein r is a numerical value of more than 0 and equal to or less than 2, and s is a numerical value of more than 0 and equal to or less than 0.2.

4. The single crystal for a scintillator according to claim 1, wherein said at least one element selected from a group consisting of elements belonging to Group 13 of the periodic table is Al and/or Ga.

5. The single crystal for a scintillator according to claim 2, wherein said at least one element selected from a group consisting of elements belonging to Group 13 of the periodic table is Al and/or Ga.

6. The single crystal for a scintillator according to claim 3, wherein said at least one element selected from a group consisting of elements belonging to Group 13 of the periodic table is Al and/or Ga.

7. A method for manufacturing a single crystal for a scintillator according to claim 1, comprising a step of preparing a raw material in which at least one element selected from a group consisting of elements belonging to Group 13 of the periodic table is contained as a constituent element at 0.0002 to 0.4 wt. % based on the entire weight of the starting materials of said single crystal.

8. A method for manufacturing a single crystal for a scintillator according to claim 2, comprising a step of preparing a raw material in which at least one element selected from a group consisting of elements belonging to Group 13 of the periodic table is contained as a constituent element at 0.0002 to 0.4 wt. % based on the entire weight of the starting materials of said single crystal.

9. A method for manufacturing a single crystal for a scintillator according to claim 3, comprising a step of preparing a raw material in which at least one element selected from a group consisting of elements belonging to Group 13 of the periodic table is contained as a constituent element at 0.0002 to 0.4 wt. % based on the entire weight of the starting materials of said single crystal.

10. A method for manufacturing a single crystal for a scintillator according to claim 4, comprising a step of preparing a raw material in which at least one element selected from a group consisting of elements belonging to Group 13 of the periodic table is contained as a constituent element at 0.0002 to 0.4 wt. % based on the entire weight of the starting materials of said single crystal.

11. A method for manufacturing a single crystal for a scintillator according to claim 5, comprising a step of preparing a raw material in which at least one element selected from a group consisting of elements belonging to Group 13 of the periodic table is contained as a constituent element at 0.0002 to 0.4 wt. % based on the entire weight of the starting materials of said single crystal.

12. A method for manufacturing a single crystal for a scintillator according to claim 6, comprising a step of preparing a raw material in which at least one element selected from a group consisting of elements belonging to Group 13 of the periodic table is contained as a constituent element at 0.0002 to 0.4 wt. % based on the entire weight of the starting materials of said single crystal.

13. The single crystal for a scintillator of claim 1, wherein said a single crystal of a cerium-activated orthosilicate compound is represented by said general formula (1).

14. The single crystal for a scintillator of claim 1, wherein said a single crystal of a cerium-activated orthosilicate compound is represented by said general formula (2).

* * * * *